United States Patent [19]

Davis

[11] Patent Number: 4,826,585
[45] Date of Patent: May 2, 1989

[54] PLASMA PROCESSING APPARATUS

[75] Inventor: Mervyn H. Davis, Chichester, England

[73] Assignee: Nordiko Limited, Hampshire, England

[21] Appl. No.: 94,146

[22] Filed: Sep. 8, 1987

[30] Foreign Application Priority Data

Sep. 23, 1986 [GB] United Kingdom ............... 8622820

[51] Int. Cl.[4] .................. H01H 1/46; C23C 16/00; B01J 19/12
[52] U.S. Cl. .................................. 204/298; 156/345; 118/723; 422/186.04
[58] Field of Search ............ 204/192.32, 298, 298 EP, 204/298 EE; 156/345, 643; 118/723; 427/47; 422/186.04–186.06

[56] References Cited

U.S. PATENT DOCUMENTS 4,483,737 11/1984 Mantei ................................ 156/643
4,491,496 1/1985 Laporte et al. ..................... 156/345

FOREIGN PATENT DOCUMENTS 0200651 11/1986 France .

OTHER PUBLICATIONS

B. N. Chapman et al, *IBM Technical Disclosure Bulletin*, vol. 21, No. 3, Aug. 1978, p. 1197.
Proceedings of the 3eme Symposium International sur le Gravure Seche et le Depot Plasma en Microeletronique, Cachan, Nov. 26-29, 1985, pp. 145-153.
*J. Vac. Sci. Technol.*, B4(1), Jan./Feb., 1986, pp. 1-5.
*Appl. Phys. Lett.* 43(1), Jul. 1, 1983, pp. 84-86.
Abstract No. 279 in Extended Abstracts of the Electrochemical Society Meeting vol. 86-2, (1986), p. 418.
*Solid State Technology*, Apr. 1985, pp. 263-265.
*Appl. Phys. Lett.* 37(7), Oct. 1, 1980, pp. 646-648.

*Primary Examiner*—Aaron Weisstuch
*Attorney, Agent, or Firm*—Armstrong, Nikaido, Marmelstein & Kubovcik

[57] ABSTRACT

An electrode assembly is described for use in plasma processes, such as reactive dry etching and plasma deposition. This includes a primary electrode which is electrically insulated from the vacuum chamber in which it is mounted in use. The primary electrode may be connected to an r.f. or d.c. power source and has a cylindrical hole with an insulated subsidiary electrode at the bottom of the hole which can be earthed or allowed to adopt a floating voltage in use. Magnets are used to trap electrons adjacent the walls of the hole. These may consist of a plurality of elongate magnets positioned around an annular pole plate with their largest dimension arranged longitudinally with respect to the pole plate and the hole, with their magnetic axes arranged radially, and with alternating polarity around the inner periphery of the pole plate. In use an r.f. frequency (e.g. 13.56 MHz) may be applied to the primary electrode while a reactant gas (e.g. $C_2F_6$ or a $C_2F_6/CHF_3$ mixture) is admitted to the vacuum chamber. The silicon wafer or other substrate to be etched is placed on a substrate table within the chamber which can also be connected to an r.f. power source.

22 Claims, 2 Drawing Sheets

PLASMA PROCESSING APPARATUS

This invention relates to an electrode assembly and to apparatus incorporating such an electrode assembly. In particular it relates to an electrode assembly for use in plasma processing apparatus, such as a reactive dry etching apparatus or a plasma deposition apparatus.

The manufacture of integrated circuits on a wafer of a semi-conductor material generally involves a whole series of processing steps in the course of which layers of material are deposited on or grown on selected areas of the wafer or selected areas of the wafer are modified by techniques such as ion implantation so as to produce the desired junctions between semi-conductor layers of different composition.

A number of these processing steps may involve application of a photo-resist layer to the wafer in order to protect those areas of the wafer where treatment is not wanted. Often application of a photo-resist layer is preceded by an oxidation step in which the surface of the wafer is heated in a suitable oxidising atmosphere, e.g. oxygen, in order to form a layer of silicon dioxide on the surface of the wafer. Thereafter it is necessary to etch the wafer in order to remove the layer of silicon dioxide from those areas which are not protected by the photo-resist layer so as to expose the underlying silicon-based substrate for further treatment, e.g. sputtering or ion implantation. In any such etching step the aim is to effect anisotropic etching, that is to say to etch only material lying on that part of the surface of the wafer which is not protected by the photo-resist layer so that etching proceeds only in a direction normal to the surface of the underlying silicon-based layer and so that lateral etching, which would lead to undercutting of the edges of the photo-resist layer, is avoided.

Initially, wet etching methods were used in order to strip silicon dioxide from the underlying silicon-based substrate, at least in those areas which are not protected by a photo-resist layer. The baths used for such etching processes contain noxious chemicals, such as hydrofluoric acid, which represent a considerable health and safety hazard. Moreover the use of liquid etching solutions complicates the production process. In addition etching occurs isotropically on all areas of the exposed silicon dioxide layer with the result that some undercutting of the edges of the photo-resist layer inevitably occurs, thus giving rise to loss of precision of definition of the areas protected by the photo-resist.

More recently, there has been developed the so-called reactive dry etching process which can be used, for example, for removal of silicon dioxide layers. In this case the wafer to be etched is exposed to an atmosphere of an etchant gas, such as hexafluoroethane or a mixture of hexafluoroethane and trifluoromethane, which is simultaneously subjected to plasma discharge conditions. The plasma discharge is thought to result in production of $F^+$ ions, and $CF_3^+$ ions, as well as $CF_3 \cdot$ radicals; these reactive species then react with and remove the silicon dioxide so as to expose the underlying silicon based layer.

An apparatus has been described by C. Le Jeune et al for reactive dry etching or plasma deposition in which an r.f. frequency (13.56 MHz) is applied to a multitubular copper cathode mounted within an earthed cylindrical vacuum chamber having a plurality of elongate ferrite magnets arranged at spaced intervals around the periphery of the chamber, each with its magnetic axis arranged radially with respect to the chamber and with the magnets arranged with alternating polarities around the periphery of the chamber. Gas can be admitted to the chamber which is further provided with an anticathode of independent polarity which is capacitively coupled to earth. Further details can be found in a paper which appeared in Proceedings of the 3àme Symposium International sur le Gravure Seche et le Dépôt Plasma en Microelectronique, Cachan, Nov. 26–29, 1985, pages 145 to 153, entitled "Triode HF à confinement multipolaire pour réacteur de gravure ou de dépôt".

The use of microwaves to produce plasmas for anisotropic etching of silicon using $SF_6$/Ar has been described by C. Pomot et al, *J. Vac. Sci. Technol.*, B4(1), January/February 1986, pages 1 to 5. This apparatus includes a cylindrical vacuum chamber, operating at earth potential for safety reasons, which is lined with permanent magnets.

A plasma etching reactor with a multipolar field confinement layer is described by T. D. Mantei et al in *Appl. Phys. Lett.* 43(1), July 1, 1983, pages 84 to 86, in Abstract No. 279 in Extended Abstracts of the Electrochemical Society Meeting, Vol. 86-2, (1986), page 418, and in *Solid State Technology*, April 1985, pages 263 to 265. The magnets are positioned around the vacuum chamber wall which must be earthed for safety reasons. Hot tungsten filaments are used to produce the plasma. However the use of hot filaments is unsatisfactory as they burn out after a relatively short period of operation and there is a risk of sputtered material from the filaments contaminating the wafer or other substrate being etched.

Although reactive dry etching avoids the use of noxious solutions and enables etching to take place under conditions compatible with the use of a "clean room", yet the processes used heretofore have, in most cases, enabled only moderate etching rates to be achieved, e.g. of the order of 50 nanometers per minute or less, with the end result that the etching step represents one of the slowest steps in the overall process for manufacturing an integrated micro-circuit. As a result, any etching step, of which several may be used in the course of production of a given integrated micro-circuit, represents a bottle-neck in the process.

It would accordingly be desirable to provide an improved method of effecting reactive dry etching and apparatus for use therein which would enable high anisotropic etching rates to be achieved, that is to say anisotropic etching rates of the order of about 500 nanometers minute or higher, for example about 700 nanometers per minute. It would also be desirable to provide a reactive dry etching process and apparatus suitable for use therein in which highly anisotropic etching can be achieved and in which the danger of contamination with sputtered filament material is avoided.

For deposition of layers on a semi-conductor wafer one technique that can be used is plasma deposition. This process is also known as glow discharge deposition or as plasma enhanced chemical vapor deposition. For example, a layer of silicon can be applied by exposing the wafer to an atmosphere of silane under plasma producing conditions. The methods used heretofore have, however, been relatively slow processes and their use in production of integrated micro-circuits represents a bottle neck in the overall production process.

Use of a cylindrical multipole magnetic wall in conjunction with a hot cathode d.c. discharge for production of a silane plasma is described by B. Drevillon et al in *Appl. Phys. Lett.* 37(7), Oct. 1, 1980, pages 646 to 648. This apparatus uses hot filaments which burn out in use and may result in contamination of the deposited silicon layer with material sputtered from the hot filament.

It would accordingly be desirable to provide a plasma deposition process and apparatus suitable for use therein in which enhanced rates of deposition can be achieved and in which the risk of contamination of the deposited layer is minimised.

The present invention accordingly seeks to provide an improved electrode assembly, more particularly an electrode assembly, which can be used in plasma processing apparatus. It further seeks to provide an electrode assembly and apparatus incorporating same which enables enhanced rates of dry reactive etching and of plasma deposition to be achieved. Yet again it seeks to provide a process for treatment of a substrate with a reactant gas under plasma producing conditions which results in enhanced rates of treatment compared with known methods. It further seeks to provide an electrode assembly and plasma processing apparatus incorporating such an electrode in which the risk of contamination of substrate being treated by sputtered material is avoided.

According to the present invention, there is provided an electrode assembly for use in plasma processing apparatus comprising mounting means for mounting the assembly in a vacuum chamber, a primary electrode having a hole formed therein, insulating means for insulating the primary electrode from the body of the vacuum chamber, means for connecting the primary electrode to an r.f. or d.c. power source, a subsidiary electrode mounted within or adjacent the hole and electrically insulated from the primary electrode, and magnet means for trapping electrons adjacent the wall of the hole in use of the assembly by producing lines of magnetic flux within the hole which extend in a curve from the wall of the hole and return thereto so as to form an arch over a respective one of a plurality of wall regions which extend substantially longitudinally of the wall of the hole.

The primary electrode in use may be connected to a d.c. power source; preferably, however, it will be connected in use to an r.f. power source.

According to another aspect of the present invention, there is provided plasma processing apparatus for treating a substrate under plasma forming conditions in a reactant gas atmosphere comprising a vacuum chamber, a substrate table within the vacuum chamber for supporting a substrate to be treated, means for connecting the substrate table to a power source, a primary electrode having a hole formed therein, insulating means for insulating the primary electrode from the walls of the vacuum chamber, means for connecting the primary electrode to an r.f. or d.c. power source, a subsidiary electrode mounted within or adjacent the hole and electrically insulated from the primary electrode, magnet means for trapping electrons adjacent the wall of the hole in use of the apparatus by producing lines of magnetic flux which extend in a curve from the wall of the hole and return thereto so as to form an arch over a respective one of a plurality of wall regions which extend substantially longitudinally of the wall of the hole, vacuum pump means for evacuating the vacuum chamber, and means for introducing a reactant gas into the chamber for treatment of the substrate.

The hole in the primary electrode may extend right through the primary electrode, in which case the subsidiary electrode is conveniently positioned against one end thereof. However, in a particularly preferred form of constructions, the primary electrode has a cavity formed therein and the subsidiary electrode forms at least a part of the bottom of the cavity. The subsidiary electrode is insulated from the primary electrode; conveniently a layer of insulation, e.g. an insulating ring, separates the subsidiary electrode from the primary electrode.

The subsidiary electrode may be allowed to adopt a floating potential in use of the electrode assembly. Preferably, however, the subsidiary electrode is arranged for connection to earth. A switch may be provided to allow the subsidiary electrode either to adopt a floating voltage or to be connected to earth.

The substrate table is preferably connected to an r.f. power source.

The hole in the primary electrode may have any convenient cross section and its interior dimensions may vary with depth from the open end of from one of its open ends. In a particularly preferred form the hole has a substantially cylindrical wall; in this case the hole is of circular cross section. However it is also envisaged that the hole can be elliptical in section or polygonal in section, e.g. octagonal or duodecagonal.

Although it is convenient to form the hole of uniform cross section throughout its depth, it is alternatively possible to form the primary electrode with a hole of varying cross section, for example a conical hole or a barrel-shaped hole.

The magnet means conveniently comprises an annular pole plate and a plurality of elongate magnets magnetically coupled with the pole plate, each aligned substantially longitudinally with respect to the hole and each having its magnetic axis aligned substantially radially with respect to the hole, and with the polarities of the magnets alternating around the pole plate. Conveniently permanent magnets are used, although the use of electromagnets is not ruled out.

The magnets are preferably selected to have a magnetic field strength of at least about 1 kGauss, for example a magnetic field strength in the range of from about 1 kGauss to about 2 kGauss. Such field strengths can be attained with the aid of samarium-cobalt magnets.

This multipolar arrangement of magnets gives rise to a magnetic field within the hole in the primary electrode whose lines of magnetic force form arches over longitudinal regions of the wall of the hole from the north pole of one magnet to the south pole of each of the magnets adjacent thereto. In this way a series of more or less open-ended magnetic "tunnels", each extending longitudinally of the hole in the primary electrode, is formed. This magnetic field pattern traps many, but not all, of the electrons formed in production of the plasma and enhances the plasma density. However, some of the electrons can escape to the subsidiary electrode or to an adjacent earthed surface, thereby inducing a suitable negative voltage on the primary electrode, for example a voltage in the range of frm about—10 volts to about—50 volts, when the primary electrode is connected to an r.f. power source. Such a self bias voltage should not be so large, however, that there is danger of sputtering of the electrode material, since sputtered material could contaminate a substrate being treated.

Separate r.f. power sources may be used to provide r.f. power to the primary electrode and to the substrate table respectively. Alternatively a single r.f. power supply may be used, the output from which is divided between the primary electrode and the substrate table.

The r.f. power source or sources is or are arranged to deliver r.f. power at a suitable frequency, preferably one of the officially approved frequencies for such power sources, e.g. 13.56 MHz.

The plasma processing apparatus is operated under plasma forming conditions. Such conditions include operation at a low pressure, preferably at a pressure of less than about $10^{-4}$ millibar. Typically the pressure of operation lies in the range of from about $5 \times 10^{-4}$ millibar to about $10^{-2}$ millibar, e.g. about $2 \times 10^{-3}$ millibar.

In a reactive dry etching process for etching silicon dioxide layers, the reactant gas may be, for example, a silicon halide, such as $SiF_4$ or $SiCl_4$, or a halocarbon, such as a fluorocarbon, such as hexafluoroethane or a mixture of hexafluoroethane and trifluoromethane. Materials containing both chlorine and fluorine substituents may also be used, such as $CF_2Cl_2$.

In a typical plasma deposition process, the reactant gas is silane ($SiH_4$).

The voltage of the primary electrode in operation is typically from about $-20$ volts to about $-40$ volts, whilst the voltage of the substrate table may vary from about $-100$ volts up to about $-2000$ volts.

In order that the invention may be clearly understood and readily carried into effect a preferred embodiment thereof will now be described, by way of example only, with reference to the accompanying diagrammatic drawings, wherein.

Figure 1:
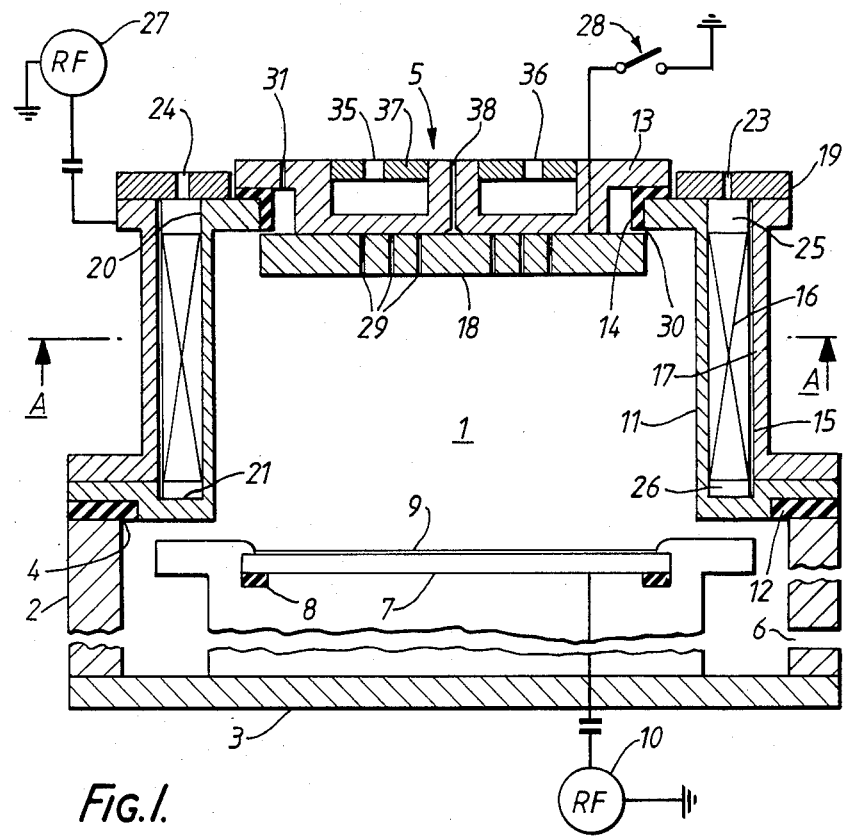
FIG. 1 is a vertical section through a reactive dry etching apparatus including an electrode assembly constructed according to the invention.

Referring to the drawings, a reactive dry etching apparatus comprises a vacuum chamber 1 of circular section whose wall is generally indicated at 2 and whose base plate is indicated at 3. A seal (not shown) is provided on base plate 3 to provide a vacuum tight seal with wall 2. The upper part of the chamber, including wall 2 and the electrode assembly, which is described further below, can be lifted off base plate 3, conveniently with the aid of a hydraulic ram, in order to obtain access to the interior of the vacuum chamber 1.

The upper end of vacuum chamber 1 defines a circular opening 4 in which is mounted an electrode assembly 5 constructed in accordance with the invention. One or more apertures 6 are provided in conventional manner in wall 2 to form connections for vacuum pumps (not shown) by means of which the pressure within vacuum chamber 1 can be reduced to a suitably low pressure, e.g. about $10^{-4}$ millibar.

A substrate table 7 is mounted on an insulating ring 8 at the bottom of vacuum chamber 1 and supports a silicon wafer 9 which is to be subjected to reactive dry etching in the illustrated apparatus. A clamping ring (not shown) is provided to retain wafer 9 on substrate table 7. Substrate table 7 is provided with a connection to a vacuum pump (also not shown) by means of which a vacuum can be established between silicon wafer 9 and substrate table 7; helium is then introduced under a pressure of, for example, 2 to 15 millibars between wafer 9 and table 7 so as to provide good thermal conductivity between these two items. A conventional cooling arrangement (not shown) is used to cool table 7 in use by means of coolant fluid, e.g. water. This arrangement for supporting and cooling wafer 9 on table 7 is conventional and need not be further described. Table 7 is also connected capacitively to an r.f. power supply source indicated at 10.

Electrode assembly 5 comprises an annular inner housing 11 made of an aluminum or aluminum alloy which is supported in opening 4 by an insulating ring 12. At its upper end inner housing 11 carries a gas head body 13 which is electrically isolated from inner housing 11 by an insulating ring 14.

Figure 2:
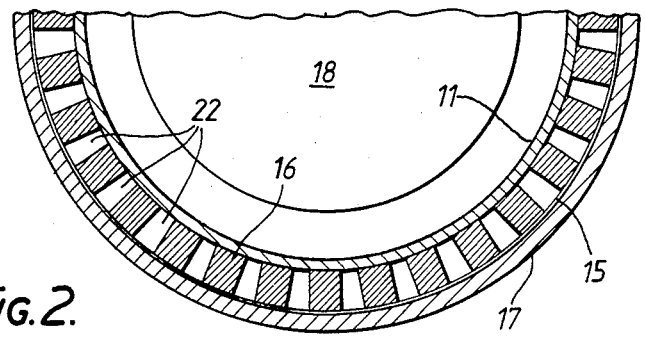
FIG. 2 is a horizontal section on the line A—A of FIG. 1.
Figure 3:
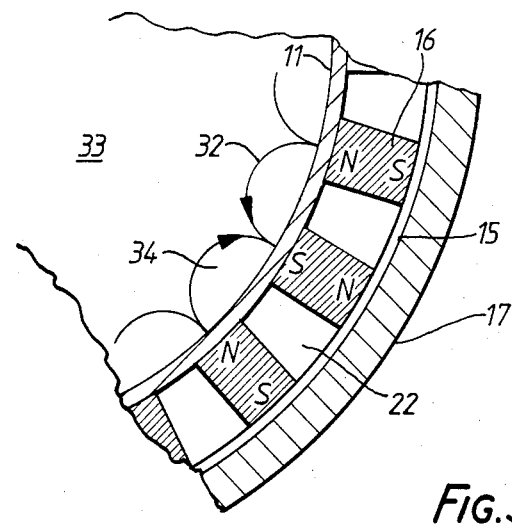
FIG. 3 is a view on an enlarged scale of part of FIG. 2.

A hollow cylindrical pole plate 15 made of a suitable magnetic iron alloy is supported by inner housing 11. A plurality of permanent bar magnets 16 are secured longitudinally to the cylindrical inner face of pole plate 15. Preferably the strongest available magnets, e.g. samarium-cobalt magnets, are used. Typically such magnets exhibit a field strength of the order of 1 to 2 kGauss. As illustrated in FIG. 2, there are thirty two magnets example thirty or less (e.g. 24) or forty or more (e.g. forty eight, for be used, provided that there is an even number of magnets 16. These are evenly spaced around the inner periphery of pole plate 15 with their longest dimension arranged substantially parallel to the axis of the pole plate 15. As indicated in FIG. 3, however, their magnetic axes are arranged radially with respect to the pole plate 15 so that their respective north and south poles (indicated as N and S in FIG. 3) are separated in the direction of their shortest dimension, the magnets 16 being arranged with alternating magnetic polarity around the inner periphery of pole plate 15.

Around pole plate 15 is an outer housing 17, also made of aluminum or aluminum alloy cladding. Gas head body 13 carries on its lower face a subsidiary electrode 18, which is typically made of aluminum or aluminium alloy cladding, and is surrounded by a blanking ring 19, also conveniently made of aluminum alloy.

Figure 4:
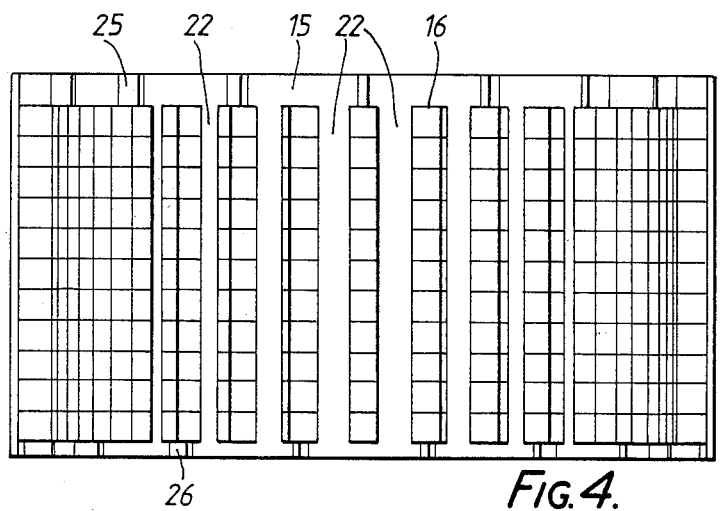
FIG. 4 is a vertical section through the magnet assembly of the electrode assembly.

Above magnets 16 is an annular groove 20 and below these is a corresponding annular groove 21. Grooves 20 and 21 communicate with each other via the spaces 22 between adjacent magnets 16. The grooves 20 and 21 and the spaces 22 form channels for coolant fluid (e.g. water) by means of which the magnets 16 and pole plate 15 can be cooled in use. Reference numerals 23, 24 indicate coolant fluid supply and withdrawal conduits. Baffles 25, 26 are provided in grooves 20 and 21, as can be seen in FIG. 4, in order to make the coolant fluid follow a predetermined path.

Outer housing 17 is connected capacitively to an r.f. power source 27. Wall 2 is earthed; subsidiary electrode 18 can either be earthed, if switch 28 is closed, or allowed to adopt a floating voltage, if switch 28 is left open.

Reference numerals 29 indicate gas passages through subsidiary electrode 13 for admission of etchant gas, e.g. $C_2F_6$ or a $C_2F_6/CHF_3$ mixture. For clarity, only a few gas passages 29 are shown in FIG. 1; however, it will be appreciated by those skilled in the art that best distribution of etchant gas will be achieved with a relatively large number of passages 29 distributed in a suitable pattern over electrode 18. Alternatively, etchant gas may be admitted peripherally of subsidiary electrode 18, by means of the small gap 30 between this electrode and insulating ring 14, via gas passage 31.

FIG. 3 indicates the lines of magnetic force 32 which extend from the inner surface of inner housing 11 into the hole 33 in the electrode assembly 5 and back into the wall of the hole in an arch over regions 34 which extend longitudinally of the hole 33, parallel to its axis. These lines of magnetic force trap electrons from the plasma which is formed under the influence of the r.f. power supply in hole 33, leaving the gas in the central part of the hole 33 depleted of electrons and containing free positive ions, such as $F^+$ and $CF_3^+$ ions. Because the arches formed by the lines of magnetic force over the regions 34 are open ended some of the electrons can escape to the subsidiary electrode 18. This gives rise to a negative bias on the surface of the inner housing 11 of the r.f. electrode and, as a result, the substrate table 7 becomes biassed to a negative voltage which attracts the positive ions (e.g. $F^+$ and/or $CF_3^+$) and hence enhances bombardment of the substrate with such ions, thereby enhancing the etching rate.

Reference numerals 35, 36 indicate respective inlet and outlet connections in a closing plate 37 for supply of coolant fluid (e.g. water) to gas head body 13. Etchant gas can be fed to gas passages 29 through bore 38.

In use of the illustrated apparatus the vacuum chamber 1 is opened by raising the top portion thereof off base plate 3. Then a silicon wafer 9 having a covering layer of silicon dioxide upon which a photo-resist layer has been printed in a predetermined pattern is placed on substrate table 7 and clamped into place. After lowering the top portion of the chamber 1 back on to the base plate 3 the small amount of air trapped behind wafer 9 is then sucked out under vacuum and the space between wafer 9 and table 7 is filled with helium at a pressure of about 10 millibar. The coolant fluid (e.g. water) supplies for table 7 and to inlets 23 and 35 are also turned on. Vacuum chamber 1 is then evacuated via passages 6 to a pressure of $10^{-5}$ millibar or less; this can be achieved by pumping in two or more stages, using a rotary oil sealed pump in the initial stages and a high vacuum pump in the later stages of pumping. Next a reactant gas, e.g. $C_2F_6$ or a 20:1 $C_2F_6$:$CHF_3$ molar mixture, is admitted at a controlled rate to the chamber 1 by means of bore 38 and gas passages 29 or by means of gas passage 31 and gap 30. The rate of admission of reactant gas is controlled so that a predetermined pressure, e.g. about $2\times10^{-3}$ millibar, prevails in vacuum chamber 1. The r.f. power sources 10 and 27 are then turned on and switch 28 is closed. Typically, the power delivered by r.f. power supply 10 is of the order of 75 watts whilst the power delivered by r.f. power supply 27 is of the order of 1 kilowatt. This results in establishment of a reactive plasma as indicated by development of a lilac glow within vacuum chamber 1. The magnetic field pattern established by magnets 16 enhances the plasma density. Measurement of the voltage of pole plate 15 indicates that this is biassed to a voltage of approximately −30 volts whilst substrate table 7 acquires an induced voltage of approximately −200 volts. Under such conditions the observed rate of etching of silicon dioxide is of the order of 500 nanometers per minute or more; a rate of etching as high as 700 nanometers per second has been achieved under favourable conditions. Moreover, the uniformity of etching over the wafer is extremely good. Highly anisotropic etching is also observed from the areas of the wafer 9 which are not protected by the photo-resist until the underlying silicon layer is exposed. As the only remaining silicon dioxide is then the layer under the photo-resist, lateral etching will then occur which leads thereupon to undercutting of the photo-resist layer. Hence it is important to stop etching after the areas not protected by photo-resist have been laid bare of silicon dioxide and before any significant amount of lateral etching can take place.

In a similar way it is possible to use the illustrated apparatus for plasma deposition of materials on a substrate, such as a silicon wafer, for example by plasma decomposition of silicon hydride to deposit silicon.

It will be appreciated by those skilled in the art that, although two separate r.f. power sources 10 and 27 are shown, the necessary r.f. frequency power can be drawn from a single power source and divided as necessary to produce the requisite voltages on the electrodes and on the substrate table. Such voltages should be controlled, particularly in the case of the upper electrode 18, to a value less than that at which significant sputtering of the aluminum oxide layer on inner housing 11 will occur.

Although the apparatus has been described using r.f. power sources to produce a self bias voltage on the primary electrode 11, it is alternatively possible to operate the apparatus with a d.c. potential applied to this electrode.

In a modification of the illustrated apparatus a load lock is provided for introduction of silicon wafers. In this way the step of opening the chamber 1 by raising its upper portion is obviated.

It will be appreciated by those skilled in the art that, as the drawings are diagrammatic, further items, such as securing bolts, insulating sleeves therefor, clamps, O-rings and gaskets, will be required in practice in order to enable the necessary low pressure operating environment within vacuum chamber 1 to be established and maintained. Such items of equipment will be provided as necessary in accordance with conventional practice.

What is claimed is:

1. A plasma processing apparatus, which comprises an open-ended body for defining a first part of a vacuum chamber, a substratre table within a first part of the vacuum chamber for supporting a substrate to be treated and for connection to a power source, and an electrode assembly comprising: mounting means for mounting the assembly in a vacuum tight manner on the open end of the body to form a second part of the vacuum chamber; a primary electrode having a hole formed therein; insulating means for insulating the primary electrode from the body; means for connecting the primary electrode to an r.f. power source; a subsidiary electrode mounted within or adjacent the hole and electrically insulated from the primary electrode; and magnet means for trapping electrons adjacent the wall of the hole and for producing lines of magnetic flux within the hole which extend in a curve from the wall of the hole and which return so as to form an arch over a respective one of a plurality of wall regions which extend substantially longitudinally of the wall of the hole in a zone above and spaced from the substrate table.

2. An apparatus according to claim 1, wherein the hole is a cavity having a closed end, and wherein the subsidiary electrode forms at least a part of the closed end of the cavity.

3. An apparatus according to claim 1, in which the subsidiary electrode is arranged for connection to earth.

4. An apparatus according to claim 1, in which the hole has a substantially cylindrical wall.

5. An apparatus according to claim 4, in which the magnet means comprises an annular pole plate and a plurality of elongate magnets magnetically coupled with the pole plate each aligned substantially longitudinally with respect to the hole and each having its magnetic axis aligned substantially radially with respect to the hole, and in which the polarities of the magnets alternate around the pole plate.

6. An apparatus according to claim 5, in which the magnets are positioned on the inside face of the pole plate.

7. An apparatus according to claim 5, in which the pole plate has cylindrical inner and outer surfaces.

8. An apparatus according to claim 1, in which the primary electrode is provided with an aluminum or aluminum alloy cladding.

9. An apparatus according to claim 8, in which the cladding includes a cylindrical lining to the hole.

10. Plasma processing apparatus for treating a substrate under plasma forming conditions in a reactant gas atmosphere and having a vacuum chamber formed by an open-ended body for defining a first part of the vacuum chamber and by an electrode assembly which is fitted to the open end of the first part in a vacuum type manner and for defining a second part of the vacuum chamber, said electrode assembly comprising:
  (i) a primay electrode having a hold formed therein;
  (ii) insulating means for insulating the primary electrode from the walls of the first part of the vacuum chamber;
  (iii) means for connecting the primary electrode to an r.f. power source;
  (iv) a subsidiary electrode mounted within or adjacent the hole and electrically insulated from the primary electrode; and
  (v) magnet means for trapping electrons adjacent the wall of the hole by producing lines of magnetic flux within the hole which extend in a curve from the wall of the hole and which return so as to form an arch over a respective one of a plurality of wall regions which extends substantially longitudinally of the wall of the hole and form a zone of lines of magnetic flux.

11. Apparatus according to claim 10, wherein the hole is a cavity having a closed end, and wherein the subsidiary electrode forms at least a part of the closed end of the cavity.

12. Apparatus according to claim 10, in which the subsidiary electrode is grounded.

13. Apparatus according to claim 10, in which the hole has a substantially cylindrical wall.

14. Apparatus according to claim 13, in which the magnet means comprises an annular pole plate and a plurality of elongate magnets magnetically coupled with the pole plate each aligned substantially longitudinally with respect to the hole and each having its magnetic axis aligned substantially radially with respect to the hole, and in which the polarities of the magnets alternate around the pole plate.

15. Apparatus according to claim 14, in which the magnets are positioned on the inside face of the pole plate.

16. Apparatus according to claim 14, in which the pole plate has cylindrical inner and outer surfaces.

17. Apparatus according to claim 10, in which the primary electrode is provided with an aluminum or aluminum alloy cladding.

18. Apparatus according to claim 17, in which the cladding includes a cylindrical lining to the hole.

19. Apparatus according to claim 10, in which the primary electrode is connected to an r.f. power source.

20. Apparatus according to claim 19, in which separate r.f. power sources are used to provide r.f. power to the primary electrode and to the substrate table respectively.

21. Apparatus according to claim 19, in which a single r.f. power supply is used, the output from which is divided between the primary electrode and the substrate table.

22. Apparatus according to claim 10, in which the primary electrode is connected to a d.c. power source.

* * * * *